US008994495B2

(12) United States Patent
Dassanayake et al.

(10) Patent No.: US 8,994,495 B2

(45) Date of Patent: Mar. 31, 2015

(54) VIRTUAL VEHICLE ENTRY KEYPAD AND METHOD OF USE THEREOF

(75) Inventors: Mahendra Somasara Dassanayake, Bloomfield Hills, MI (US); John Robert Van Wiemeersch, Novi, MI (US); Yitah Richard Wu, Ypsilanti, MI (US); Jeff Allen Greenberg, Ann Arbor, MI (US); Donald Paul Bilger, Livonia, MI (US); Mark George Vojtisek, Royal Oak, MI (US); Chad A. Widrick, Oak Park, MI (US); Patrick Holub, Novi, MI (US)

(73) Assignee: Ford Global Technologies, Dearborn, MI (US)

( * ) Notice: Subject to any disclaimer, the term of this patent is extended or adjusted under 35 U.S.C. 154(b) by 82 days.

(21) Appl. No.: 13/546,852

(22) Filed: Jul. 11, 2012

(65) Prior Publication Data

US 2014/0015637 A1 Jan. 16, 2014

(51) Int. Cl.

| | |
|---|---|
| ***G05B 19/00*** | (2006.01) |
| ***B60R 25/10*** | (2013.01) |
| ***G05B 23/02*** | (2006.01) |
| ***G05B 23/00*** | (2006.01) |
| ***B60Q 1/00*** | (2006.01) |
| ***B60Q 3/00*** | (2006.01) |
| ***H03M 11/00*** | (2006.01) |
| ***H03M 1/10*** | (2006.01) |
| ***G07C 9/00*** | (2006.01) |

(52) U.S. Cl.

CPC .......... *G07C 9/00174* (2013.01); *G07C 9/0069* (2013.01); *G07C 2209/64* (2013.01)

USPC ..... 340/5.54; 340/426.35; 340/3.1; 340/5.23; 340/5.72; 362/487; 362/459; 362/501; 341/33; 341/120

(58) Field of Classification Search

USPC .............. 340/3.1, 10.7, 5.23, 5.26, 5.72, 505, 340/815.47, 815.48, 426.35; 313/510, 511, 313/512; 341/33, 22, 20

See application file for complete search history.

(56) References Cited

U.S. PATENT DOCUMENTS

| | | | | |
|---|---|---|---|---|
| 4,818,048 | A | 4/1989 | Moss | |
| 5,969,698 | A | 10/1999 | Richard | |
| 7,248,151 | B2 | 7/2007 | McCall | |
| 7,255,466 | B2 * | 8/2007 | Schmidt et al. | 362/501 |

(Continued)

FOREIGN PATENT DOCUMENTS

| | | | |
|---|---|---|---|
| GB | 2162806 | A | 2/1986 |
| GB | 2408593 | A | 6/2005 |
| WO | WO 2004066221 | A1 | 8/2004 |

*Primary Examiner* — Jennifer Mehmood

*Assistant Examiner* — Mirza Alam

(74) *Attorney, Agent, or Firm* — Angela M. Brunetti; Frank MacKenzie

(57) ABSTRACT

Keypad indicia are integral with a window of a vehicle. The keypad indicia are formed using a ultra-violet (UV) fluorescent dye that is nearly invisible to a human eye until exposed to UV light. A UV light emitting device of the vehicle is configured for outputting UV light. The light emitting device is mounted for enabling the keypad indicia to be exposed to the outputted UV light thereby causing the keypad indicia to become readily visible by the human eye. An imaging device of the vehicle captures user interaction with the keypad indicia while the keypad indicia is exposed to the outputted UV light. The keypad interaction processor determines if a sequence of body part movements with respect to the keypad indicia that is captured by the imaging device during exposure of the keypad indicia to the outputted light corresponds to an access code of the vehicle.

29 Claims, 4 Drawing Sheets

(56) References Cited

U.S. PATENT DOCUMENTS

| | | | | |
|---|---|---|---|---|
| 7,417,681 | B2 | 8/2008 | Lieberman et al. | |
| 7,670,006 | B2 | 3/2010 | Lieberman | |
| 7,911,321 | B2 * | 3/2011 | Bingle et al. | 340/5.54 |
| 2003/0128188 | A1 | 7/2003 | Wilbrink | |
| 2005/0140832 | A1 | 6/2005 | Goldman | |
| 2005/0190040 | A1 * | 9/2005 | Huntzicker et al. | 340/5.54 |
| 2006/0145825 | A1 * | 7/2006 | Mc Call | 340/426.35 |
| 2006/0238385 | A1 * | 10/2006 | Steenwyk et al. | 341/33 |
| 2006/0262549 | A1 | 11/2006 | Schmidt et al. | |
| 2007/0222760 | A1 | 9/2007 | Lieberman | |
| 2007/0276550 | A1 | 11/2007 | Desai et al. | |
| 2008/0062706 | A1 * | 3/2008 | Feldmeier | 362/459 |
| 2009/0322706 | A1 | 12/2009 | Austin | |
| 2010/0296303 | A1 * | 11/2010 | Sarioglu et al. | 362/487 |
| 2011/0090097 | A1 * | 4/2011 | Beshke | 341/20 |
| 2011/0267262 | A1 | 11/2011 | Gollier | |

* cited by examiner

VIRTUAL VEHICLE ENTRY KEYPAD AND METHOD OF USE THEREOF

FIELD OF THE DISCLOSURE

The disclosures made herein relate generally to vehicle keyless entry keypad systems and methods and, more particularly, to a virtual vehicle entry keypad comprising a light emitting device and keypad indicia that are made visible by exposure to light from the light emitting device.

BACKGROUND

In keyless entry keypad systems, a vehicle entry keypad is generally positioned on the exterior of a driver's door and is used to lock and unlock one or more doors of the vehicle. The driver uses the vehicle entry keypad for causing the driver door and/or all doors of the vehicle to become unlocked in response to successfully inputting a factory-designated or vehicle owner designated code on the vehicle entry keypad. Generally, the vehicle entry keypad is electrically coupled to an electronic controller. The electronic controller controls a mechanism to unlock/lock the vehicle in response to the designated code being successfully inputted by the driver via the vehicle entry keypad. In this manner, the vehicle entry keypad allows the driver to unlock (and lock) the doors without the use of a key. Once a valid code is recognized, other single digit entries within a short period of a few seconds, may also perform secondary functions such as releasing the decklid or opening a power liftgate.

In some implementations of a vehicle entry keypad, the vehicle entry keypad has been moved from the vehicle door to the B-pillar (i.e., pillar between the front door and glass immediately rearward the front door) for reasons such as cost reduction and/or improved appearance (e.g., through use of touch panel technology). Some vehicles, however, do not have a B-pillar or have a B-pillar that is too thin for practically having the vehicle entry keypad integral therewith. Placement of a vehicle entry keypad on an exterior door handle was once a common practice. However, it now has limited practicality since the handle on many vehicles now have LF antennas and capacitive lock and unlock switches to support passive entry intelligent access systems. This has result in no or limited available space within the handle. Similarly, placement of a vehicle entry keypad directly on moveable glass of the vehicle door has had limited practicality, as it requires a costly connection solution.

Therefore, implementation of a vehicle entry keypad that overcomes the abovementioned drawbacks and limitations would be advantageous, desirable and useful.

SUMMARY OF THE DISCLOSURE

Embodiments of the present invention are directed to implementation of a vehicle entry keypad that overcomes drawbacks and limitations associated with prior art approaches to integrating a vehicle entry keypad into a vehicle. Specifically, preferred embodiments of the present invention are directed to a virtual vehicle entry keypad comprising a ultra-violet (UV) light emitter and keypad indicia that is made visible by illumination with light from the UV light emitter. In this manner, the keypad indicia are otherwise substantially invisible to the human eye (i.e., when not being illuminated with light from the UV light emitter). A window of the vehicle has the keypad indicia integral therewith, or on the glass surface, and illumination of the UV reactive keypad indicia by UV light outputted by the UV light emitter causes the keypad indicia to become visible by the human eye. In a preferred embodiment, the keypad indicia are formed from a dye that becomes visible to the human eye while being exposed to light within the UV spectrum. When the driver grabs the door handle, a capacitive sensor or a conventional switch is used to initiate a search for a passive entry intelligent key. If no key is located, the UV emitter will be activated along with an imaging device (e.g., a camera). The imaging device monitors a sequence of finger placements on the UV illuminated keypad indicia for enabling a determination to be made as to whether a vehicle access code has been entered via the keypad indicia during its illumination by the UV light emitter. Advantageously, such an implementation of a virtual vehicle entry keypad provides for a cost effective approach to integrating the vehicle entry keypad into a window of a vehicle without adversely inhibiting visibility through the window or require costly electrical connections.

In one embodiment of the present invention, a keyless entry keypad system for a vehicle comprises a vehicle window, a light emitting device, and an imaging device. The vehicle window has an access code entry region integral therewith. The access code entry region includes a layer of light reactive substance that transitions from being nearly invisible to a human eye to being highly visible to the human eye when exposed to light of a specified wavelength and intensity configuration. The light emitting device is configured for outputting light of the specified configuration. The access code entry region and the light emitting device are jointly configured for causing access code entering indicia to become highly visible to the human eye within the layer of light reactive substance when the layer of light reactive substance is exposed to the outputted light. The imaging device captures user interaction with the access code entering indicia while the access code entry region is being exposed to the outputted light.

In another embodiment of the present invention, a keyless entry keypad apparatus of a vehicle comprises keypad indicia integral with a window of the vehicle, a light emitting device, and an imaging device. The keypad indicia is formed using a substance that transitions from being nearly invisible to a human eye to being highly visible to the human eye when exposed to light of a specified configuration. The light emitting device is configured for outputting light of the specified configuration. The keypad indicia and the light emitting device are relatively positioned for causing the keypad indicia to be exposed to the outputted light such that the keypad indicia transitions to being highly visible to the human eye. The imaging device captures user interaction with the keypad indicia while the keypad indicia are exposed to the outputted light.

In another embodiment of the present invention, a vehicle comprises a window having keypad indicia provided thereon, an ultra-violet (UV) light emitting device, an imaging device, and a keypad interaction processor. The keypad indicia are formed using a UV fluorescent dye that is nearly invisible to a human eye until exposed to UV light. The UV light emitting device is configured for outputting UV light. The light emitting device is mounted on the vehicle for enabling the keypad indicia to be exposed to the outputted UV light thereby causing the keypad indicia to become readily visible by the human eye. The imaging device captures user interaction with the keypad indicia while the keypad indicia is exposed to the outputted UV light. The keypad interaction processor determines if a sequence of body part movements with respect to the keypad indicia that is captured by the imaging device during exposure of the keypad indicia to the outputted light corresponds to an access code of the vehicle.

In another embodiment of the present invention, a method of using a virtual vehicle entry keypad that is integral with a window of a vehicle to gain access to an interior space of the vehicle comprises a plurality of operations. An operation is performed for detecting presence of a person attempting to gain access to the interior space of the vehicle through a door of the vehicle. After detecting presence of the person, an operation is performed for determining that manual access authentication is required by the person for allowing access to the interior space. In response to determining that manual access authentication is required, an operation is performed for energizing a light emitting device for causing light of a specified configuration to be outputted therefrom. The outputted light causes the virtual vehicle entry keypad to become visible by a human eye within a layer of light reactive substance integral with the window. The layer of light reactive substance is nearly invisible to the human eye when not exposed to the outputted light. Thereafter, an operation is performed for monitoring interaction between the person and the virtual vehicle entry keypad while the light emitting device is energized followed by an operation being performed for determining if the monitored interaction corresponds to successful entry of an access code required for enabling the person to gain access to the interior space of the vehicle.

These and other objects, embodiments, advantages and/or distinctions of the present invention will become readily apparent upon further review of the following specification, associated drawings and appended claims.

DETAILED DESCRIPTION OF THE DRAWING FIGURES

Figure 1:
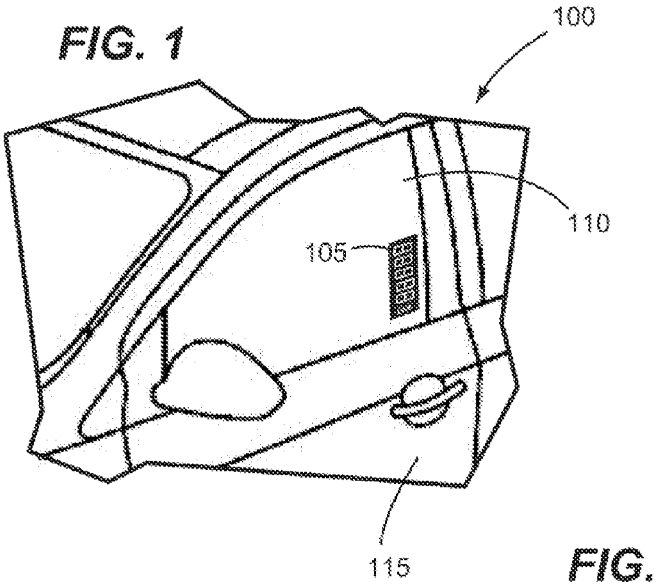
FIG. 1 is a fragmentary perspective view showing a vehicle having a virtual vehicle entry keypad configured in accordance with an embodiment of the present invention.

FIG. 1 shows a vehicle 100 configured in accordance with the present invention. As shown in FIG. 1, the vehicle 100 is configured with a virtual vehicle entry keypad 105. The virtual vehicle entry keypad 105 is displayed within (i.e., integral with) a window 110 of a driver door 115 of the vehicle 100. A person skilled in the art will appreciate that a virtual vehicle entry keypad configured in accordance with the present invention can be integral with a different window of the vehicle beside or in addition to a driver door window.

Figure 2:
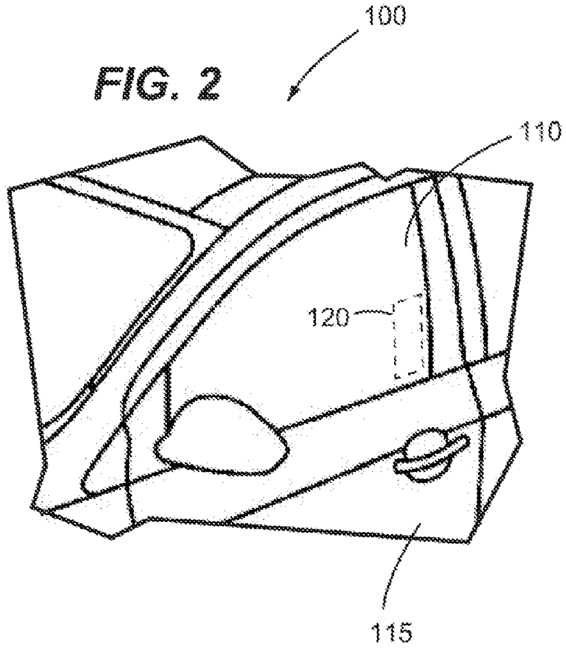
FIG. 2 shows an access code entering region in which the virtual vehicle entry keypad of FIG. 1 becomes visible.

The virtual vehicle entry keypad 105 is selectively displayable. As shown in FIGS. 1 and 2 and as discussed below in greater detail, the virtual vehicle entry keypad 105 can be transitioned between a state in which it is highly visible (FIG. 1) to a human eye and a state where by it is nearly or entirely invisible to the human eye (FIG. 2). Additionally, the region 105 can be horizontal or vertical or on any window of the vehicle 100. It is disclosed herein that, in the context of the present invention, a windshield is considered to be a window. Advantageously, integration of the virtual vehicle entry keypad 105 into the window 110 provides for a more modern and cosmetically appealing keyless entry solution and can be readily utilized on a vehicle that does not have a B-pillar (e.g., such as on various sports-type cars, convertibles, and the like).

Figure 3:
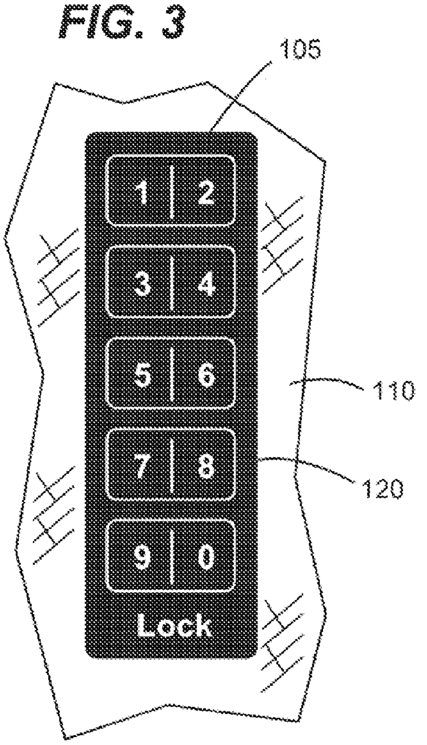
FIG. 3 is an enlarged view of the virtual vehicle entry keypad of FIG. 1.

As discussed below in greater detail, a person (e.g., a driver of the vehicle 100) seeking to gain access to an interior space of the vehicle 100 and, optionally, to control other power systems (e.g., windows, decklid release, lift gate open, convertible top down, etc,) or to start the vehicle 100 without a physical key uses the virtual vehicle entry keypad 105 to enter an access code. In response to the access code being successfully entered, the person is granted access to the interior space of the vehicle 100 by the driver door 115 being unlocked by a keyless entry keypad system or the person is granted access to another system of the vehicle and, optionally, allowing the person to start the vehicle without a physical ignition key. As shown in FIG. 3, the virtual vehicle entry keypad 105 includes indicia used for entering the access code (e.g., numbers 0-9) and can include a global lock command icon indicia (e.g., text reading "lock").

Figure 4:
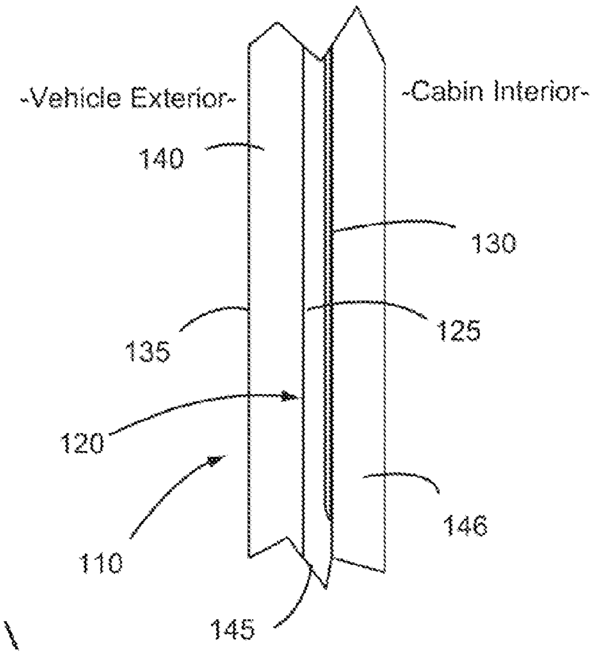
FIG. 4 is a fragmentary side view showing a window of the vehicle in FIG. 1, which has an access code entry region that is suitably configured for enabling display of the virtual vehicle entry keypad.

The virtual vehicle entry keypad 105 defines an access code entry region 120 of the window 110. As shown in FIG. 4, the access code entry region 120 includes a layer of light reactive substance 125 that transitions from being entirely or nearly invisible to a human eye to being highly visible to the human eye when exposed to light of a specified configuration. In preferred embodiments, the layer of light reactive substance 120 is positioned adjacent to an interior space side 130 of the window 110 (i.e., not exposed to the exterior surface 135 of the window 110). As shown in FIG. 4, the layer of light reactive substance 125 can be positioned at an interface between an interior glass layer 146 and a polymeric layer 145 (e.g., polyvinyl butyral (PVB) layer) of the window 110 such as that of a laminate window construction having an interior glass layer 146 in addition to the exterior glass layer 140. This preferred position reduces exposure from natural UV light from the sun. Alternatively, the light reactive substance 125 can be formed on the side of the polymeric layer 145 or the exterior glass layer 140 that faces the exterior of the vehicle 100. It is also disclosed herein that virtual vehicle entry keypad indicia configured in accordance with the present invention can be provided on an interior surface of glazing using a sticker or ink application process.

In certain embodiments, light of the specified configuration is light within the ultra-violet (UV) light spectrum and the light reactive substance is a chemical composition that exhibits light fluorescing functionality when exposed to light in the UV light spectrum. A UV fluorescent dye is an example of such a chemical composition that exhibits light fluorescing functionality when exposed to light in the UV light spectrum. In this regard, a preferred wavelength for light and for light reactivity of the light reactive substance is about 405 nanometers. However, the present invention is not unnecessarily limited to a light of a particular wavelength. In embodiments where the light reactive substance is a chemical composition that is reactive to light in the spectrum within light from ambient light sources (e.g., UV light), light transmission inhibitors that are commonly used in automotive window applications (e.g., within or on the exterior glass layer 140 of window 110) will significantly reduce if not eliminate the potential for ambient light causing the virtual vehicle entry keypad 105 from unintentionally becoming visible due to such ambient light.

A UV fluorescent dye of a type preferable for use with embodiments of the present invention will emit high energy at the proper wavelength to become highly visible and the resulting glow gives the appearance of high uniform density. Such a preferred UV dye can be applied at a concentration that will cause it to light-up (i.e., fluoresce which chases them to become visible) when radiated with correct irradiance (i.e., by light at a target wavelength), but does not cause it to light-up under ambient light. Accordingly, molecular density of such a preferred UV fluorescent dye will be relatively low (i.e., a relatively low spatial density) so that transparency is achieved at normal visible light spectrums but spaced properly to achieve uniform appearance at the target wavelength. To this end, in general, a UV fluorescent dye of a type preferable for use with embodiments of the present invention can have a molecular construct in the scale of about 10^2 nanometers to about 10^5 nanometers. For example, a UV fluorescent dye of a type preferable for use with embodiments of the present invention can be a Rylene type dye, which can be considered to have a nano-construct and be a nano-emitter.

Figure 5:
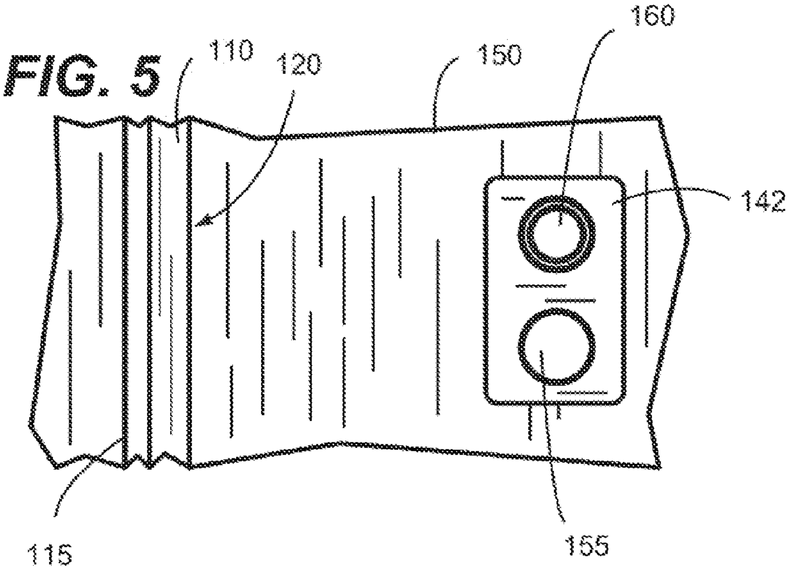
FIG. 5 is a fragmentary top view showing a relative placement of a virtual keypad module and window of a door of the vehicle of FIG. 1 on which the virtual keypad module is mounted.
Figure 6:
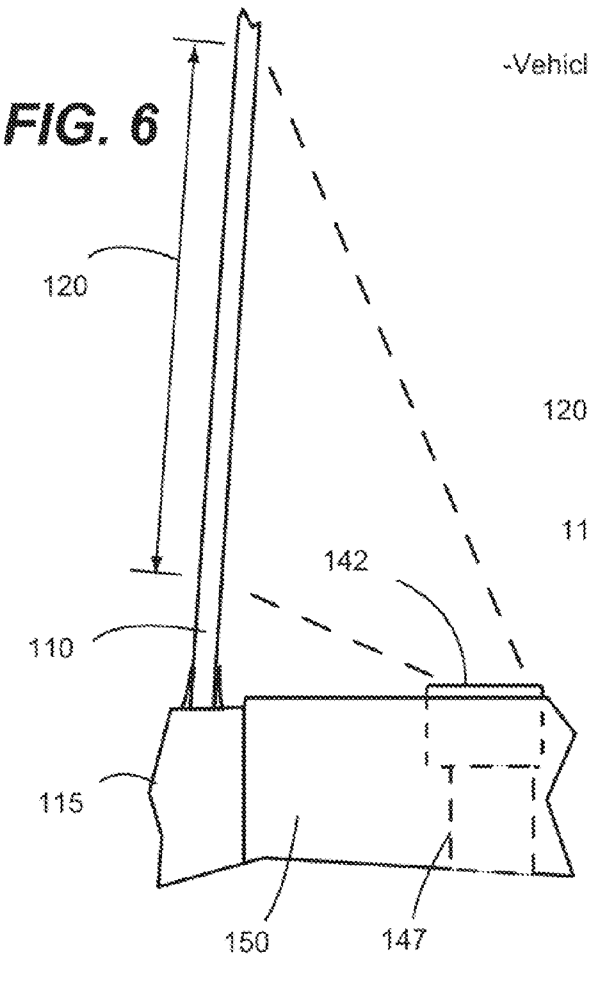
FIG. 6 is a fragmentary side view of the door, window, and virtual keypad shown in FIG. 5.

Referring now to FIGS. 5 and 6, a virtual keypad module 142 is mounted on the door 115 of the vehicle 100. For example, the virtual keypad module 142 can be mounted on an interior support structure 147 of the door 115 and extend through an opening in a interior trim panel 150 of the door 115 or can be mounted directly on the interior trim panel 150. Alternatively, the virtual keypad module 142 can be mounted on a dashboard of the vehicle 100 or an instrument panel of the vehicle 100.

The virtual keypad module 142 includes a light emitting device 155 and an imaging device 160. A light emitting diode (LED) and a laser diode are two examples of the light emitting device 155. In certain embodiments, the light emitting device 155 will output predominately light within the UV light spectrum. A camera configured to capture light in the visible light spectrum and/or infrared light spectrum is an example of the imaging device 160. As previously mentioned, the virtual keypad module 142, including the light emitting device 155 and an imaging device 160, can also be fitted to any door or on the instrument panel for illumination and image detection off the windshield. Although a windshield keypad systems does not allow for good keypad ergonomics, it can significantly reduce the cost since most windshields have a PVB layer but not all side glass has PVB lamination.

Through selective operation of the light emitting device 155, the virtual vehicle entry keypad 105 can be made accessible (i.e., visible) to a person for interaction therewith. As shown in FIG. 6, The virtual keypad module 142 is positioned relative to the window 110 for enabling an entire portion of the access code entry region 120 of the window 110 to be exposed to light being emitted from the light emitting device 155 and for enabling the imaging device 160 to capture an image of interaction between a person and the virtual vehicle entry keypad 105 while the access code entry region 120 is being exposed to light being emitted from the light emitting device 155. In this regard, interaction between the person and the virtual vehicle entry keypad 105 can be monitored while the person is attempting to successfully enter an access code via the virtual vehicle entry keypad 105.

In view of the disclosures made herein, a skilled person will appreciate that there are a number of manners in which the light reactive substance 125 can pattered to form the access code entry region 120 and the light emitting device can be correspondingly configured. For example, in one embodiment (i.e., a broadcast light embodiment), the layer of light reactive substance 125 is formed in the shape and/or pattern of the virtual vehicle entry keypad 105 using an UV light reactive composition such that broadcasting of UV light from the light emitting device 155 onto the access code entry region 120 causes the virtual vehicle entry keypad 105 to become visible. In another embodiment (i.e., a laser projection embodiment), the layer of light reactive substance 125 is formed in the shape of a substantially solid area (e.g., a rectangle without static keypad indicia) using an UV light reactive composition and UV light from the light emitting device 155 (i.e., implemented as a laser) is projected or scanned onto the access code entry region 120 in a manner that causes an image of the virtual vehicle entry keypad 105 to be generated within the layer of light reactive substance 125. Use of a light emitting device configured as a laser allows configurability for different modes and different purposes such as a numeric keypad keyboard, alpha keypad, textual feedback on locking states, and also providing numbers, letters and words customized to the language of the country of sale or the language selected by the vehicle operator. Additionally, use of a laser projection implementation of the virtual vehicle entry keypad on a solid keypad access area allows flexibility to create custom images and fonts for styling purposes. A preferred embodiment of the laser projection embodiment integrates an optical touch camera with the projection hardware in an assembly similar to a borescope or endoscope, using relay lens assemblies or coherent optical fiber bundles to carry the projected image to the screen area and the viewed image back to the camera sensor. An exit pupil of the projection optic may be positioned on the top edge of the door trim, in or near the area typically used for the mechanical door lock knob, and the main bulk of the camera and projector may be packaged out of sight between the door inner panel and the door trim. Alternatively, the exit pupil may be positioned within the lock knob (i.e., lock soldier) in such a way that it can project the image pattern onto the target area of the glass and sense gestures in that area if required for an optical touch sensing system. Another advantage of the laser embodiment is that lock status can be indicated on the keypad zone 105. The word “LOCK” as shown in FIG. 3 could be transitioned to “LOCKED” shortly after the lock command is executed and then displayed as LOCKED for a few seconds. Furthermore, confirmation of a transition to the locked state can be visually confirmed by a visual queue depicted via the virtual vehicle entry keypad 105. For example, a fast blink of the virtual vehicle entry keypad 105 can serves as a confirmation that the vehicle has transitioned to a locked state.

Figure 7:
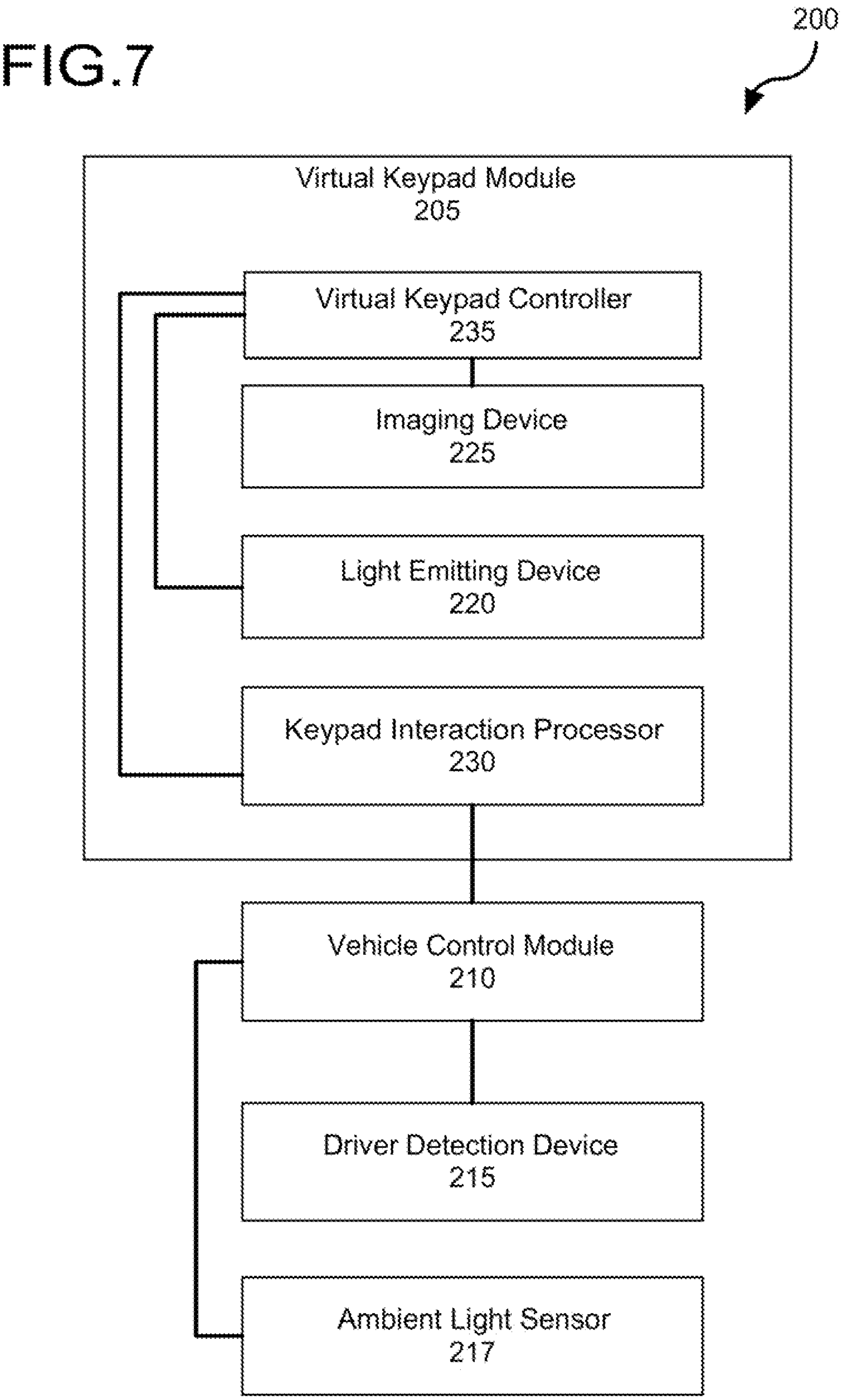
FIG. 7 is a block diagram showing a vehicle control architecture configured in accordance with an embodiment of the present invention.

Turning now to a discussion of FIG. 7, a vehicle control architecture 200 configured in accordance with an embodiment of the present invention is shown. The vehicle control architecture 200 includes a virtual keypad module 205, a vehicle control module 210, a driver detection device 215, and an ambient light sensor 217. The vehicle control module 210 is coupled between the virtual keypad module 205, the driver detection device 215, and the ambient light sensor 217. The vehicle control module 210 can be configured in accordance with an industry-recognized body control module (BCM) for providing functionality well known to be provided thereby, which includes receiving signals from the driver detection device 215 (e.g., a Passive Entry Passive Start device (PEPS) signal from the person attempting to gain access to the vehicle or grip sensors in the door handle that detect a handle grab), determining if manual access authentication is required (e.g., successful entry of an access code into a vehicle entry keypad), and outputting appropriate control signals in response to either the PEPS signal being detected or the access code being successfully manually entered (e.g., a signal causing a door lock to be moved from a locked state to an unlocked state). The driver detection device 215 can be a door handle configured for outputting a signal corresponding to contact/movement of the door handle being detected and/or presence of a PEPS transponder being detected (e.g., the person seeking to gain access to the vehicle having a PEPS transponder in their possession). Although the keypad would not be needed for entry when the person possess the PEPS device, detection of the PEPS device and display of other potential functions on the virtual detection zone 105 would allow more features to be executed from the outside of the vehicle than are practical to place on the PEPS device as buttons. The list of expanded features could include those discussed previously (e.g., decklid, window, moon roof, top, and gate controls) plus additional features such as audio or light controls displayed on the glass to allow the customer to control radio stations, volume, media modes and the like from the exterior of the vehicle for events such as, for example, tailgate parties or lighting the area, for campouts or night time sledding.

The virtual keypad module 205 can be configured in the same or similar manner as the virtual keypad module 142 discussed above in reference to FIGS. 5 and 6. In addition to having a light emitting device 220 and an imaging device 225 (e.g., the same or similar as the light emitting device 155 and the imaging device 160 discussed above in reference to FIG. 5), the virtual keypad module 205 includes a keypad interaction processor 230 and a virtual keypad controller 235. The keypad interaction processor 230 uses information received from the visible light camera to determine if a sequence of body part movements with respect to keypad indicia of the virtual vehicle entry keypad corresponds to an access code of the vehicle. For example, during operation of the light emitting device 220, the imaging device 225 captures a sequence of finger movements with respect to access code entering indicia of the virtual vehicle entry keypad and then determines if such finger movements correspond to the vehicle access code having been entered at the virtual vehicle entry keypad. The virtual keypad controller 235 can control operation/activation of the light emitting device 220, the imaging device 225 and the keypad interaction processor 230. The virtual keypad controller 235 can also interface with the vehicle control module 210 for enabling information (e.g., command signals) to be communicated therebetween. Using information such as that provided by the ambient light sensor 217, the virtual keypad controller 235 can also be configured for determining an ambient light level and/or a solar intensity level, determining an illumination intensity for the light emitting device dependent upon the ambient light level and/or the solar intensity level, and then cause the light emitting device to be energized in a manner that causes light outputted from the light emitting device to be at the illumination intensity appropriate for best keypad viewing in the detected ambient light conditions. Electrical power can be provided directly to the virtual keypad module 205 from a power source or can be provided to the virtual keypad module 205 through the vehicle control module 210.

Figure 8:
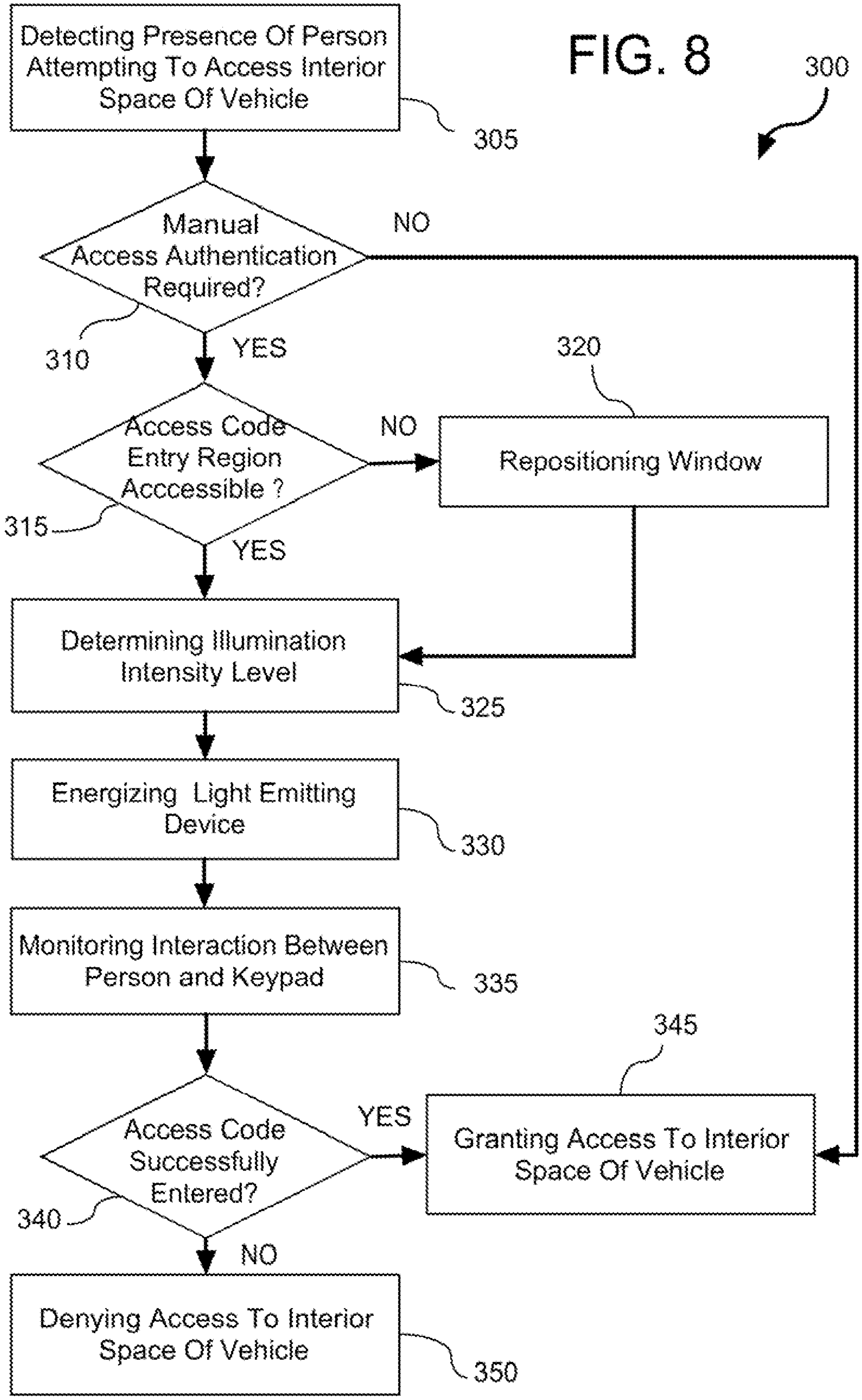
FIG. 8 is a flow diagram showing a method configured for implementing virtual vehicle entry keypad functionality in accordance with an embodiment of the present invention.

FIG. 8 shows a method 300 configured for implementing virtual vehicle entry keypad functionality in accordance with an embodiment of the present invention. The method 300 begins with operation 305 for detecting presence of a person attempting to gain access to the interior space of the vehicle through a door of the vehicle. Such detection can include receiving signals from a door handle of the vehicle (e.g., movement thereof and/or contact therewith). After detecting presence of the person, an operation 310 is performed for determining that manual access authentication is required by the person for allowing access to the interior space. For example, a step of detecting possession of and authentication from a PEPS transponder can have failed thereby requiring manual authentication of the person.

In response to determining that manual access authentication is required, an operation 315 is performed for determining if the access code entry region is sufficiently accessible to the person for enabling display of and interaction with the virtual vehicle entry keypad. Specifically, a condition in which all or a portion of the access code entry region would not be accessible if the window was in a sufficiently lowered position (e.g., such as for allowing venting of the vehicle). If it is determined that the access code entry region is not sufficiently accessible due to the window being in a fully or partially lowered position, an operation 320 is performed for repositioning the window (e.g., fully or partially raising it). Thereafter, or if it was determined that the access code entry region was already accessible, the method 300 continues at an operation 325 for determining an illumination intensity level for the light emitting device. In one embodiment, determining the illumination intensity level includes determining an ambient light level and/or a solar intensity level and then determining an illumination intensity to which the light emitting device should be activated to achieve. Determining the ambient light level can include receiving light intensity information from the imaging device and/or receiving solar intensity information from a sun load sensor. An operation 330 is then performed for energizing the light emitting device for light to be outputted at the required illumination intensity level thereby causing the virtual vehicle entry keypad to become visible by a human eye within a layer of light reactive substance integral with the window at the access code entry region. As discussed above, the layer of light reactive substance is nearly invisible to the human eye when not exposed to the outputted light from the light emitting device.

Next, an operation is performed for monitoring interaction between the person and the virtual vehicle entry keypad by an imaging device while the light emitting device is energized. In response to or in conjunction with monitoring the monitoring interaction between the person and the virtual vehicle entry keypad, an operation 340 is performed for determining if the monitored interaction corresponds to successful entry of an access code required for enabling the person to gain access to the interior space of the vehicle and, optionally, to control various function and/or to start the vehicle without a physical key. In response to it being determined that the access code has been successfully entered, an operation 345 is performed for granting access to the interior space of the vehicle (e.g., causing one or more doors to be unlocked) and, optionally, allowing the person control various function and/or to start the vehicle without the use of a physical (i.e., ignition) key. Otherwise, an operation 350 is performed for denying the person access to the interior space of the vehicle.

Referring now to instructions processable by a data processing device, it will be understood from the disclosures made herein that methods, processes and/or operations adapted for carrying out virtual vehicle entry keypad functionality as disclosed herein are tangibly embodied by computer readable medium having instructions thereon that are configured for carrying out such functionality. In one specific embodiment, the instructions are tangibly embodied for carrying out the method 300 disclosed above. The instructions may be accessible by one or more data processing devices from a memory apparatus, from an apparatus readable by a drive unit of a data processing system, or both. Accordingly, embodiments of computer readable medium in accordance with the present invention include a compact disk, a hard drive, RAM, Flash memory, or other type of storage apparatus that has imaged thereon a computer program (i.e., instructions) adapted for carrying out virtual vehicle entry keypad functionality in accordance with the present invention.

In the preceding detailed description, reference has been made to the accompanying drawings that form a part hereof, and in which are shown by way of illustration specific embodiments in which the present invention may be practiced. These embodiments, and certain variants thereof, have been described in sufficient detail to enable those skilled in the art to practice embodiments of the present invention. It is to be understood that other suitable embodiments may be utilized and that logical, mechanical chemical and electrical changes may be made without departing from the spirit or scope of such inventive disclosures. To avoid unnecessary detail, the description omits certain information known to those skilled in the art. The preceding detailed description is, therefore, not intended to be limited to the specific forms set forth herein, but on the contrary, it is intended to cover such alternatives, modifications, and equivalents, as can be reasonably included within the spirit and scope of the appended claims.

What is claimed is:

1. A keyless entry keypad system for a vehicle, comprising a vehicle window having an access code entry region integral therewith, wherein the access code entry region includes a layer of light reactive substance that transitions from being nearly invisible to a human eye to being highly visible to the human eye when exposed to light of a specified configuration;

a light emitting device configured for outputting light of the specified configuration, wherein the access code entry region and the light emitting device are jointly configured for causing access code entering indicia to become highly visible to the human eye within the layer of light reactive substance when the layer of light reactive substance is exposed to said outputted light; and an imaging device for capturing user interaction with said access code entering indicia while the access code entry region is being exposed to said outputted light.

2. The keyless entry keypad system of claim wherein:

said light reactive substance is a chemical composition that exhibits light fluorescing functionality when exposed to light in the ultra-violet (UV) light spectrum; and said outputted light is predominantly in the UV light spectrum.

3. The keyless entry keypad system of claim 2 wherein the layer of light reactive substance is one of formed on an interior space side of the vehicle window and formed at an interface between glass and polymeric layers of the vehicle window.

4. The keyless entry keypad system of claim 2 wherein said light reactive substance is a UV fluorescent dye.

5. The keyless entry keypad system of claim 4 wherein the light emitting device is one of a UV light emitting diode (LED) and a laser that emits UV light.

6. The keyless entry keypad system of claim 1 wherein:

the imaging device includes a camera configured for capturing images from visible light;

the camera and the light emitting device are both positioned on the interior space side of the vehicle window; and the vehicle window, the camera and the light emitting device are all mounted on a door of the vehicle.

7. The keyless entry keypad system of claim 1 wherein the light emitting device adjusts an intensity of said outputted light dependent upon at least one of an ambient light level and a solar intensity level.

8. A keyless entry keypad apparatus of a vehicle, comprising keypad indicia integral with a window of the vehicle, wherein said keypad indicia is formed using a substance that transitions from being nearly invisible to a human eye to being highly visible to the human eye when exposed to light of a specified configuration;

a light emitting device configured for outputting light of the specified configuration, wherein said keypad indicia and the light emitting device are relatively positioned for causing said keypad indicia to be exposed to said outputted light such that the keypad indicia transitions to being highly visible to the human eye; and an imaging device for capturing user interaction with said keypad indicia while said keypad indicia are exposed to said outputted light.

9. The keyless entry keypad apparatus of claim 8 wherein:

the substance from which said keypad indicia is formed is a chemical composition that exhibits light fluorescing functionality when exposed to light in the ultra-violet (UV) light spectrum; and the light emitting device outputs light at is predominantly in the UV light spectrum.

10. The keyless entry keypad apparatus of claim 9 wherein said keypad indicia is one of formed on an interior space side of the window and formed at an interface between glass and polymeric layers of the window.

11. The keyless entry keypad apparatus of claim 9 wherein the substance from which said keypad indicia are formed is a UV fluorescent dye.

12. The keyless entry keypad apparatus of claim 11 wherein the light emitting device includes a light emitting diode (LED) from which said light is emitted.

13. The keyless entry keypad apparatus of claim 8 wherein:

the window includes a layer of glass and a layer of polymeric material adjoined to the layer of glass;

the layer of polymeric material is adjoined to a surface of the layer of glass that faces an interior space of the vehicle when the window is mounted on the vehicle;

said keypad indicia is located one of at a position between the layer of glass and the layer of polymeric material and on a side of the layer of polymeric material that faces the interior space of the vehicle when the window is mounted on the vehicle.

14. The keyless entry keypad apparatus of claim 8 wherein:

the imaging device includes a camera configured for capturing images from visible light;

the camera and the light emitting device are both positioned on the interior space side of the window; and the window, the camera and the light emitting device are all mounted on one of a door of the vehicle.

15. The keyless entry keypad apparatus of claim 14 wherein:

the substance from which said keypad indicia are formed is a UV fluorescent dye;

said outputted light is predominantly in the UV light spectrum;

the window includes a layer of glass and a layer of polymeric material adjoined to the layer of glass;

the layer of polymeric material is adjoined to a surface of the layer of glass that faces an interior space of the vehicle when the window is mounted on the vehicle;

said keypad indicia is located, one of at a position between the layer of glass and the layer of polymeric material and on a side of the layer of polymeric material that faces the interior space of the vehicle.

16. The keyless entry keypad apparatus of claim 8 wherein the light emitting device adjusts an intensity of said outputted light dependent upon at least one of an ambient light level and a solar intensity level.

17. A vehicle, comprising a window having keypad indicia provided thereon, wherein the keypad indicia is formed using an ultra-violet (UV) fluorescent dye that is nearly invisible to a human eye until exposed to UV light;

as UV light emitting device configured for outputting UV light, wherein the light emitting device is mounted on the vehicle for enabling said keypad indicia to be exposed to said outputted UV light thereby causing said keypad indicia to become readily visible by the human eye;

an imaging device for capturing user interaction with said keypad indicia while said keypad indicia is exposed to said outputted UV light; and a keypad interaction processor for determining if a sequence of body part movements with respect to said keypad indicia that is captured by the imaging device during exposure of said keypad indicia to said outputted light corresponds to an access code of the vehicle.

18. The vehicle of claim 17 wherein the UV light emitting device includes a light emitting diode (LED) from which said UV light is emitted.

19. The vehicle of claim 17 wherein:

the window includes a layer of glass and a layer of polymeric material adjoined to the layer of glass;

the layer of polymeric material is adjoined to a surface of the layer of glass that faces an interior space of the vehicle;

said keypad indicia is located one of at a position between the layer of glass and the layer of polymeric material and on a side of the layer of polymeric material that faces the interior space of the vehicle.

20. The vehicle of claim 17 wherein:

the imaging device includes a camera configured for generating images from visible light;

the camera and the light emitting device are both positioned on the interior space side of the window; and the window, the camera and the light emitting, device are all mounted on a door of the vehicle.

21. The vehicle of claim 20 wherein:

the window includes a layer of glass and as layer of polymeric material adjoined to the layer of glass;

the layer of polymeric material is adjoined to a surface of the layer of glass that faces an interior space of the vehicle;

said keypad indicia is located one of at a position between the layer of glass and the layer of polymeric material and on a side of the layer of polymeric material that faces the interior space of the vehicle.

22. The vehicle of claim 17 wherein the light emitting device adjusts an intensity of said outputted light dependent upon at least one of an ambient light level and a solar intensity level.

23. A method of using a virtual vehicle entry keypad that is integral with a window of a vehicle to gain access to an interior space of the vehicle, comprising:

detecting presence of a person attempting to gain access to the interior space of the vehicle through a door of the vehicle;

determining that manual access authentication is required by the person for allowing access to the interior space after detecting presence of the person;

energizing a light emitting, device for causing light of a specified configuration to be outputted therefrom in response to determining that manual access authentication is required, wherein said outputted light causes the virtual vehicle entry keypad to become visible by a human eye within a layer of light reactive substance integral with the window and wherein the layer of light reactive substance is nearly invisible to the human eye when not exposed to said outputted light;

monitoring interaction between the person and the virtual vehicle entry keypad while the light emitting device is energized; and determining if said captured interaction corresponds to successful entry of an access code required for enabling the person to gain access to the interior space of the vehicle.

24. The method of claim 23, further comprising:

determining at least one of an ambient light level and as solar intensity level prior to energizing the light emitting device; and determining an illumination intensity for the light emitting device dependent upon at least one of the ambient light level and the solar intensity level;

wherein energizing the light emitting device is performed for causing said outputted light to be at about the illumination intensity.

25. The method of claim 23, further comprising:

determining a current position of the window in response to determining that manual access authentication is required; and moving the window toward a closed position thereof in response to determining that the window is in a position in which at least a portion of the virtual vehicle entry keypad is inaccessible.

26. The method of claim 23 wherein detecting presence of the person includes receiving a signal generated in response to at least one of to door handle of the vehicle being moved and receiving a signal indicating that the person has touched the door handle.

27. The method of claim 23 wherein:

the layer of light reactive substance exhibits light fluorescing functionality when exposed to light in the ultraviolet (UV) light spectrum; and energizing the light emitting device causes light predominantly in the UV light spectrum to be emitted therefrom.

28. The Method of claim 27 wherein the layer of light reactive substance is formed in the shape of the virtual vehicle entry keypad.

29. The method of claim 23 wherein:

said outputted fight is projected from the light emitting device such that said outputted light generates an image within the layer of light reactive substance; and the image is a visual representation of virtual vehicle entry keypad.

* * * * *